United States Patent [19]

Schick

[11] 4,453,127

[45] Jun. 5, 1984

[54] DETERMINATION OF TRUE ELECTRICAL CHANNEL LENGTH OF SURFACE FET

[75] Inventor: Jerome D. Schick, LaGrangeville, N.Y.

[73] Assignee: International Business Machines Corporation, Armonk, N.Y.

[21] Appl. No.: 386,495

[22] Filed: Jun. 9, 1982

[51] Int. Cl.³ .......................................... G01N 27/00
[52] U.S. Cl. .............................. 324/71.3; 324/158 T; 357/85
[58] Field of Search ................... 324/71.3, 71.5, 71.6, 324/73 PC

[56] References Cited

U.S. PATENT DOCUMENTS 3,531,716  9/1970  Tarvi et al. ...................... 324/158 R
4,296,372 10/1981  Feuerbaum ...................... 324/158 D

OTHER PUBLICATIONS

Electronics, 2/69, "Electron-Beam Testing's Gentle & Fast", pp. 92-94, Fleming.
Physics & Technology of Semiconductor Devices, A. S. Grove, John Wiley & Sons, 1967, pp. 276 and 331.
Junction Depth Measurements in a Scanning Electron Microscope, J. D. Schick, Published in Electron & Ion Beam Science & Technology, 6th Intl. Conf., pp. 177-187.
Failure Analysis of Integrated Circuits with SEM Beam Induced Currents, J. D. Schick, published in Scanning Electron Microscopy/1974 (Part IV), Proceedings of the Workshop on Failure Analysis & the SEM ITT Research Institute, pp. 949-954.
K. Okumura et al., "A Novel Method for Measurement of the Channel Length of Short Channel MOSFET's", J. Electrochem. Soc., vol. 129 (1982) Jun., No. 6, pp. 1338-1342.
C. L. Wilson, "Scanning Electron Microscope Measurements on Short Channel MOS Transistors", Solid-State Electronics, vol. 23 (1980), Apr., pp. 345-356.
J. Chern et al., "A New Method to Determine MOSFET Channel Length", IEEE Electron Device Letters, vol. EDL-1 (1980), Sep., No. 9, pp. 170-173.
Determining Doping Levels in Silicon Devices, IBM Technical Disclosure Bulletin, vol. 17, No. 8, Jan. 1975, pp. 2299-2300.
Junction Depth Measurement by an Electron Beam, IBM Technical Disclosure Bulletin, vol. 13, No. 3, Aug. 1970, p. 675.

Primary Examiner—Michael J. Tokar
Assistant Examiner—B. J. Kelley
Attorney, Agent, or Firm—T. Rao Coca

[57] ABSTRACT

The true electrical channel length of a surface FET is determined by obtaining individual electron-beam-induced-current signal traces of source and drain junctions, thus eliminating the coupling effect of the two junctions. A reliable mask is formed as a function of the measured peak-to-peak distance subtracted by the depletion width.

7 Claims, 5 Drawing Figures

DETERMINATION OF TRUE ELECTRICAL CHANNEL LENGTH OF SURFACE FET

TECHNICAL FIELD

This invention relates to determining the true electrical channel length of a surface field effect transistor by using the electron beam induced current mode of a scanning electron microscope. True electrical channel length is important in determining the mask dimension necessary for a final device having desired threshold voltage and other electrical parameters, particularly when a short channel device is to be manufactured.

BACKGROUND ART

Electrical engineers have traditionally referred to the channel length of a surface FET as the lateral distance between the source and drain regions. For example, A. S. Grove, "Physics and Technology of Semiconductor Devices", John Wiley & Sons, 1967, pages 276 and 331 show this channel length reference. This description of the channel length was adequate when FET device measurements of such factors as threshold voltage were correlated with junction bevel and stain results for long channel devices having a channel length of greater than 10 microns. The advent of shorter channel devices having a channel length of shorter than 5 microns resulted in no correlation with the bevel and stain method, due to the unreliability of the bevel and stain metallurgical delineation technique.

Junction delineation by electron-beam induced current measurement in a scanning electron microscope has become necessary. A surface field effect transistor is bevel sectioned at some shallow angle, say 10 degrees, preserving electrical contact to the source and drain diffusions, the gate, and the substrate. The chip is mounted on a TO-5 header and these four contacts are wire bonded to the header. This device is then placed in the scanning electron microscope (SEM) equipped to do electron beam induced current (EBIC) measurements. The device is connected to the EBIC current amplifier with the source and drain as inputs, and the gate and substrate as ground. With the brightness modulation mode of the SEM, a micrograph of the source and drain junctions is obtained. The distance between the two junctions is referred to as the channel length. With the line scan mode of the SEM, a trace of the source and drain junctions is obtained.

While this method is more reliable than the bevel and stain method, it has been found by the inventor of the present invention that the measurement does not give the true electrical channel length because, when both source and drain diffusions are connected in parallel, the depletion region of one junction is altered by the junction potential of the other. The electron beam induced current is generated when the hole-electron pairs generated by the electron beam striking the depletion region are swept out by the existing junction potential. Thus, when the depletion region of one junction is altered by the junction potential of the other, the EBIC indicates the altered junction.

"Junction Depth Measurements in A Scanning Electron Microscope" by J. D. Schick, published in Electron and Ion Beam Science and Technology Sixth International Conference, pages 177-187 describes a method for measuring junction depths of shallow bipolar devices utilizing EBIC signal. Measurement of the channel length of a FET is not disclosed. "Failure Analysis of Integrated Circuits With SEM Beam Induced Currents" by J. D. Schick, published in Scanning Electron Microscopy/1974 (Part IV), Proceedings of the Workshop on Failure Analysis and the SEM IIT Research Institute, pages 949-954 teaches that EBIC measurement can be used for locating failures in high density integrated circuits, identifying leakage paths in devices, measuring junction depths and base widths, and obtaining diffusion concentration profiles.

"Determining Doping Levels in Silicon Devices", IBM Technical Disclosure Bulletin, Vol. 17, No. 8, January 1975, pages 2299-2300 teaches that a scanning electron microscope EBIC measurement allows a determination of doping concentrations and also of variations of doping in a device.

"Junction Depth Measurement by An Electron Beam", IBM Technical Disclosure Bulletin, Vol. 13, No. 3, August 1970, page 675 discloses the technique to determine the depth of a PN junction by means of EBIC measurement.

DISCLOSURE OF INVENTION

Therefore, it is an object of the invention to provide a method for determining the true electrical channel length of a field effect transistor.

It is another object of the invention to provide a reliable method for determining the true electrical channel length of a field effect transistor utilizing electron beam induced current measurement.

It is a further object of the invention to provide a method for determining the true electrical channel length of a field effect transistor which can be used for determining the mask dimension of a final device.

In accordance with the invention, a surface field effect transistor (FET) is bevel sectioned at a shallow angle preserving electrical contact to the source and drain regions, the gate, and the substrate. This device is then placed in a scanning electron microscope (SEM) equipped to do electron beam induced current (EBIC) measurements. The device is connected to the EBIC amplifier (which is a current amplifier) with one of the source or drain regions being connected to the amplifier input, and the other one of the source or drain regions, the gate, and the substrate being connected to ground or a reference potential.

A line scan is made with the electron beam across the junctions near the surface to obtain a first scanning trace. By junction is meant the interface between regions of opposite type conductivity. Thus, N-type source and drain regions are formed in a P-type material for N channel devices. The particular junctions of interest here are formed by the source/substrate and the drain/substrate near the channel. The electron beam excites hole-electron pairs in the semiconductor. When this excitation takes place within the depletion region of a junction, the carriers are swept out by the existing junction potential, giving rise to a reverse current which is called electron beam induced current. This EBIC signal is used to modulate a CRT whose trace is synchronized with the scanning electron beam. When the CRT is operated in the Y-deflection mode, it results in a line scan trace having a peak at the junction of said one of the source or drain regions connected to the input. If the CRT is operated in the brightness modulation mode, it will result in a micrograph showing the circumference of said one of source or drain regions which is connected to the input. For the purpose of measurement of the channel length, the Y-deflection mode is better.

Then, the connections are changed so that the other of the source or drain regions is connected as the input and all the other contacts are connected to the reference potential. A second line scan is made across the junctions to obtain a second line scan trace having a peak at the position which corresponds to the position of said other of source or drain junction. The peak to peak distance between the first and the second line scan traces gives the distance between the source and the drain junctions. The true electrical channel length is less than the junction to junction distance by an amount equal to the sum of the two depletion region portions outside of the source and drain diffusions. The depletion width corresponding to the portion of the depletion region of the junction on the channel side can be determined from the doping profile of the diffusion and from the substrate doping in accordance with the conventional technique. Then, the depletion width is subtracted from the measured peak to peak distance. This results in the true field-free channel length of the device, which is the lateral distance in the silicon that must be inverted by suitably applied gate bias.

In order to obtain more information regarding the detailed structure of the junctions, the two line scan signals can be digitized. The data can then be stored, displayed, and analyzed. The peak to peak distance can be digitally indicated.

BEST MODE FOR CARRYING OUT THE INVENTION

Figure 1:
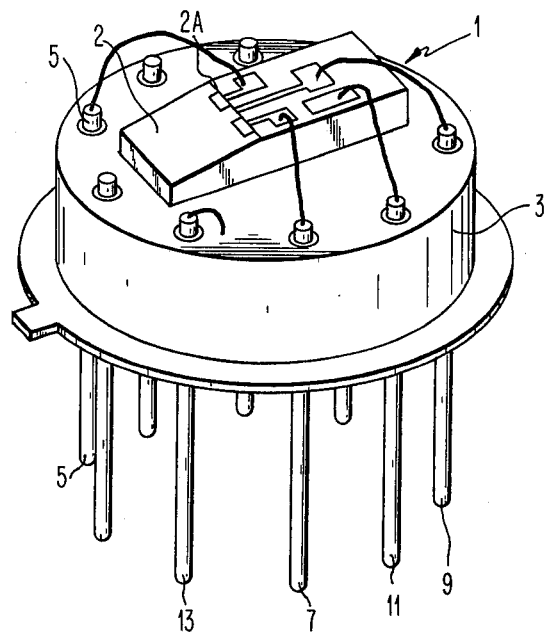
FIG. 1 schematically shows an FET chip mounted on a TO5 header which is to be placed in a SEM.

The test chip for channel length measurement is cut from a large scale integrated circuit device. One of the sides is beveled at a small angle, 10 degrees for example, to provide enlarged source and drain regions. The other three sides are cut vertically. As illustrated in FIG. 1, the test chip 1 is mounted on a TO-5 header 3 with the source and drain regions, the gate, and the substrate respectively wire bonded to source pin 5, drain pin 7, gate pin 9, and substrate pin 11 of the header. The ground pin 13 is connected to the body of the header 3. This device is then placed in the scanning electron microscope equipped to do electron beam induced current measurements. The section face 2 is placed normal to the electron beam and all five contacts are made available externally. The device is connected to the EBIC amplifier with the source pin 5 connected to the amplifier input and the drain pin 7, the gate pin 9, the substrate pin 11, and ground pin 13 connected to ground.

The SEM is set to line scan mode and a line scan is made across the junctions in section face 2 as near the surface at bevel line 2A as possible. The electron beam induced current signal generated by this scan is amplified by the EBIC amplifier, and the output of the amplifier is used to modulate a CRT which is synchronized with the scanning electron beam and is operating in the Y-deflection mode. Then, the connections are changed so that the drain is connected to the amplifier input and all the other contacts are at ground, and a second line scan is made across the junctions and exposed on the same micrograph. A double exposure resulting from this technique is shown in FIG. 2 and represents two essentially independent junctions between which is the channel region.

Figure 3:
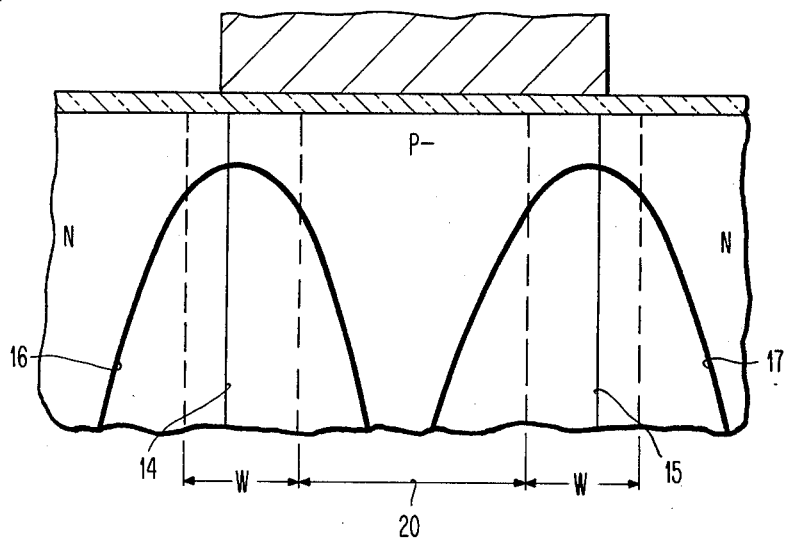
FIG. 3 shows the correlation between the first and second scanning traces and the FET structure.
Figure 2:
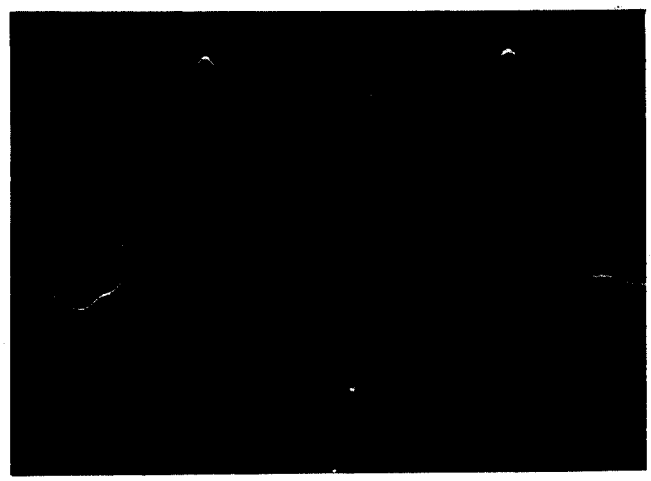
FIG. 2 is a micrograph wherein a first and second scanning traces of the bevel section of the FET are double exposed.

The correlation between the double scan trace of FIG. 2 and the device structure is schematically shown in FIG. 3. The curve 16 represents the EBIC trace of the true electrical source junction 14 while the curve 17 represents the true electrical drain junction 15. The true electrical channel length 20 is less than the junction to junction distance by an amount equal to the sum of the two depletion region portions between the source and drain diffusions. If the depletion regions were precisely symmetric, this would equal the depletion width W, since W/2 (source)+W/2 (drain)=W. The usual case is not symmetric and the depletion width must be determined if very precise measurement of the true electrical channel length is required.

The depletion widths of the source/substrate and the drain/substrate junctions are usually the same, since these two diffusions are accomplished in the same processing step. Therefore, a measurement may be performed on either the source or the drain. This measurement involves measuring the capacitance of the drain/substrate junction with no applied bias, and then determining the depletion width, W, from the following expression:

$$W = \frac{A \, \xi_o \, \xi_s}{C}$$

where A is the diffusion area (cm$^2$), $\xi_o$ is the dielectric constant for silicon, $\xi_s$ is the permitivity of free space, and C is the capacitance in Farads. The capacitance measurement can be performed using a typical capacitance meter.

Figure 4:
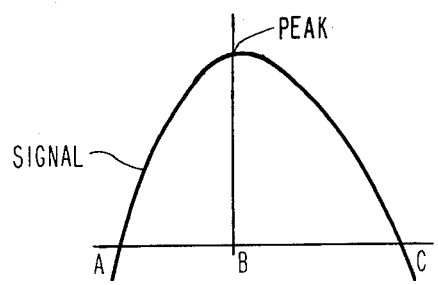
FIG. 4 shows one scanning trace with which non-symmetry of the depletion region is determined.

This technique determines the depletion width W but the non-symmetry if desired, may be obtained from the EBIC signal. This is a factor which is the ratio of the distance from the peak of the EBIC signal to one side and the peak of the EBIC signal to the other side at the same EBIC level. With the EBIC signal as shown in FIG. 4, the non-symmetry is $\overline{AB}/\overline{BC}$; that is, the distance from point A to point B divided by the distance from point B to point C.

In order to obtain more information regarding the detailed structure of the junctions, the two line scan signals which are used to make the micrograph as shown in FIG. 2 can be digitized and then be stored, displayed or analyzed however desired.

Figure 5:
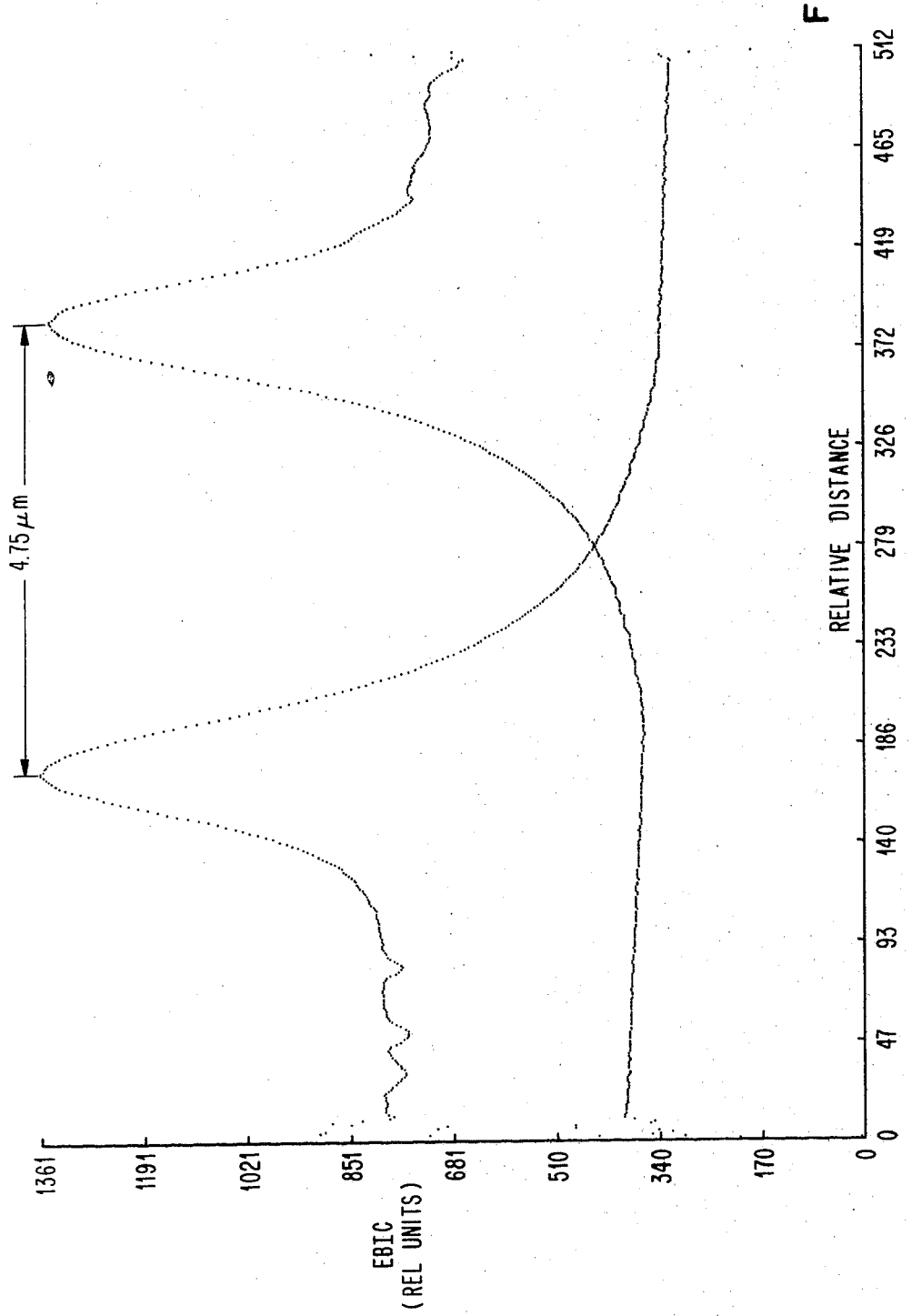
FIG. 5 shows a plot of digitized data of the first and second scanning traces.

The digitized format of the EBIC signal is accomplished by connecting the output of the current amplifier to the input of a signal averager such as Tracor Northern (Trademark) NS-570. The line scan rates are synchronized and the SEM line pulse from the scan generator is used to trigger the line in the signal averager. The result is a data plot of 512 points which exactly duplicates the line trace obtained from the micrograph. This data can be stored in a computer and then analyzed or plotted as shown in FIG. 5. A data plot like this facilitates determining the non-symmetry of an EBIC scan quite easily.

While the invention has been particularly shown and described with reference to the embodiments thereof, it will be understood by those skilled in the art that the foregoing and other changes in form and detail may be made therein without departing from the spirit and scope of the invention.

I claim:

1. A method for determining the electrical channel length of a surface field effect transistor, comprising the steps of:

bevel sectioning said field effect transistor for exposing enlarged source and drain regions, connecting either one of the source or drain regions to the input of an electron-beam-induced-current detecting means with the other of the source or drain regions, and the substrate connected to a reference potential, line scanning the bevel section of said field effect transistor with an electron beam for obtaining a first scanning trace with said detecting means, changing the connections such that the other of said source or drain regions is connected to the input of said detecting means with said one of the source or drain regions, and the substrate connected to the reference potential, and line scanning said bevel section of said field effect transistor with the electron beam for obtaining a second scanning trace with said detecting means.

2. The method of claim 1 wherein said line scanning is made by a scanning electron microscope.

3. The method of claim 2 wherein said first and second scanning traces are manifested on a single plane preserving correlation with the position of the channel side portions of the source and drain junctions.

4. The method of claim 3 wherein said first and second scanning traces are double exposed on the same micrograph.

5. The method of claim 2 wherein said first and second traces are digitized.

6. The method of claim 2 wherein peak-to-peak distance between the first and second traces are measured.

7. The method of claim 6 wherein the depletion width corresponding to the portion of the depletion region of the junction on the channel side is subtracted from the measured peak-to-peak distance to give a true electrical channel length.

* * * * *